(12) United States Patent
Foley et al.

(10) Patent No.: US 8,254,189 B2
(45) Date of Patent: Aug. 28, 2012

(54) METHOD FOR TUNING CONTROL SIGNAL ASSOCIATED WITH AT LEAST ONE MEMORY DEVICE

(75) Inventors: Nathan Wayne Foley, Lexington, KY (US); James Patrick Sharpe, Lexington, KY (US); James Alan Ward, May's Lick, KY (US); Keith Allen Wahnsiedler, Hebron, KY (US)

(73) Assignee: Lexmark International, Inc., Lexington, KY (US)

( * ) Notice: Subject to any disclaimer, the term of this patent is extended or adjusted under 35 U.S.C. 154(b) by 338 days.

(21) Appl. No.: 12/434,375

(22) Filed: May 1, 2009

(65) Prior Publication Data
US 2010/0277993 A1 Nov. 4, 2010

(51) Int. Cl.
*G11C 7/00* (2006.01)
(52) U.S. Cl. ............... 365/194; 365/233.1; 365/233.11; 365/233.13
(58) Field of Classification Search .................. 365/194, 365/233.1, 233.11, 233.13
See application file for complete search history.

(56) References Cited

U.S. PATENT DOCUMENTS

| 7,826,279 B2* | 11/2010 | Searles et al. ............ 365/189.09 |
| 2007/0109908 A1* | 5/2007 | Best ............................. 365/233 |
| 2009/0085647 A1* | 4/2009 | Hwang ........................ 327/513 |

* cited by examiner

*Primary Examiner* — Vu Le
*Assistant Examiner* — Han Yang

(57) ABSTRACT

Disclosed is a method for tuning control signals associated with one or more memory devices. The method includes performing a number of memory access operations on at least one memory device and recording results of the memory access operations. Specifically, the memory access operations are performed with different time delays for a first edge of a control signal. The control signal used for capturing data is provided by the at least one memory device. The method further includes selecting a time delay from the time delays used in the memory access operations. Moreover, the method includes utilizing the selected time delay in performing subsequent memory access operations on the at least one memory device. Also disclosed is a system including at least one memory device and an integrated circuit operatively coupled to the at least one memory device. The system incorporates the method for tuning control signals.

21 Claims, 4 Drawing Sheets

METHOD FOR TUNING CONTROL SIGNAL ASSOCIATED WITH AT LEAST ONE MEMORY DEVICE

CROSS REFERENCES TO RELATED APPLICATIONS

None.

STATEMENT REGARDING FEDERALLY SPONSORED RESEARCH OR DEVELOPMENT

None.

REFERENCE TO SEQUENTIAL LISTING, ETC.

None.

BACKGROUND

1. Field of the Disclosure

The disclosure relates generally to memory devices, and, more particularly, to a method for tuning control signals in the memory devices.

2. Description of the Related Art

Generally, processing devices, such as computers, image processing devices, and the like utilize different type of memory devices for storing information, data, firmware and the like, therein. Conventional processing devices may utilize different types of memory devices, such as a Synchronous Dynamic Random Access Memory (SDRAM), a flash memory, a Read Only Memory (ROM), and the like depending upon specific operations such memory devices are intended to perform. An SDRAM is a volatile memory device that is based on a synchronous timing platform. Specifically, the SDRAM is adapted to respond to control signals and transfer data in synchronization with a clock signal of a driving circuit, such as a memory controller, interfaced thereto. Typically, the SDRAM may be a Single Data Rate SDRAM or a Double Data Rate (DDR) SDRAM. The SDR SDRAM is adapted to transfer data on a rising edge of each clock signal while the DDR SDRAM is adapted to transfer data on both a rising and a falling edge of each clock signal thereby achieving double data rate as compared to the SDR SDRAM. In a typical SDRAM system, a plurality of SDRAMs are interfaced to a driving circuit, such as a memory controller that may be implemented in an Application Specific integrated Chip (ASIC). The driving circuit is adapted to perform a number of memory access operations, such as a READ operation and a WRITE operation, for exchanging data with the plurality of SDRAMs.

In such typical SDRAM systems, a timing specification of each SDRAM is required to be met for error-free data exchange between each SDRAM and the driving circuit. If the timing specifications are not met, information being retrieved from or transferred to the SDRAM may include errors, which is highly undesirable in advanced processing systems, such as a parallel processing system, a real-time embedded system, and the like. Also, with increase in clock speeds utilized in driving circuits, the requirement for meeting the timing specification of SDRAMs is essential. Moreover, most of the typical SDRAM systems utilize a large number of SDRAMs. Accordingly, timing requirements for all of the SDRAMs of the SDRAM system are required to be met for preventing errors in the information being exchanged with the SDRAMs.

Generally, in SDRAMs the timing requirement may be met by suitably delaying data being exchanged with respect to the clock signal of the driving circuit. For example, a typical DDR SDRAM utilizes a control signal, such as a DQS signal for enabling exchange of data (in form of "data signals") between the DDR SDRAM and a driving circuit thereof. Specifically, the DQS signal is generated by the driving circuit during a WRITE operation on the DDR SDRAM. Alternatively, the DQS signal is generated by the DDR SDRAM during a READ operation thereon. During the READ operation, the DDR SDRAM generates the data signal along with the DQS signal in a manner such that the DQS signal is edge-aligned with the data signal. For meeting the timing requirements of the DDR SDRAM during the READ operation, the driving circuit may delay the DQS signal such that the DQS signal is 90 degrees out of phase with the data signal. Specifically, the DQS signal may be aligned at a center of the data signal. Similarly, for meeting timing requirement in SDR SDRAMs, an appropriately delayed clock signal of the driving circuit is utilized such that the data exchanged between the SDR SDRAMs and the driving circuit is error-free. The appropriately delayed clock signal may be assumed to be analogous to the DQS signal used for enabling exchange of data between the DDR SDRAM and the driving circuit thereof.

As explained herein, the driving circuit may be implemented as an ASIC, which is susceptible to variation in operating environment, such as operating temperature, operating voltage and the like, thereof. Specifically, due to variation in the operating environment thereof by factors such as Process variation, Voltage variation and Temperature variation (collectively referred to as "PVT considerations"), the ASIC may not be able to meet the timing specifications of the SDRAM interfaced thereto. For example, upon variation of an ambient temperature in the vicinity of the ASIC, a DQS signal of a DDR SDRAM may be required to be appropriately delayed by the ASIC to prevent exchange of erroneous data between the ASIC and the DDR SDRAM. Accordingly, there is a requirement to tune the control signals, such as the DQS signal, in a manner such that the ASIC is adaptable to variations in the operating environment thereof. Specifically, there is a requirement to delay the control signals appropriately upon encountering changes in operating environment of the ASIC due to PVT considerations. Various techniques are known in the art to tune the control signal. One such technique involves utilization of a Digital Delay Line (DDL) for delaying the control signals digitally upon determining variation in the operating environment of the ASIC. However, known implementations of the DDL utilize a single setting to tune the control signal. Specifically, the single setting is obtained during characterization phase of the ASIC during which the ASIC is subjected to a particular range of temperature and voltage variations only. Such implementations of the DDL are not adapted to tune the control signal for real-time variations in operating environment of the ASIC. Accordingly, the ASIC is non-adaptive to real-time variations in operating environment.

Based on the foregoing, there is a need to tune control signals associated with data exchange process between an ASIC and at least one SDRAM in a manner to appropriately account for variations in operating environment of the ASIC. Specifically, there exists a need for a method for tuning a control signal associated with at least one SDRAM such that the method is adapted to account for real-time variations in operating environment of the ASIC.

SUMMARY OF THE DISCLOSURE

In view of the foregoing disadvantages inherent in the prior art, the general purpose of the present disclosure is to provide a method for tuning control signals associated with at least one memory device in a memory system to include all the advantages of the prior art, and to overcome the drawbacks inherent therein. Specifically, the present disclosure describes a method for tuning a control signal associated with at least one memory device for enabling error-free data exchange between the at least one memory device and a driving circuit thereof.

Therefore, in one aspect, the present disclosure provides a method for tuning control signals associated with at least one memory device. The method includes performing a number of memory access operations on the at least one memory device and recording results of the memory access operations. Specifically, the memory access operations are performed with different time delays for a first edge of a control signal. The control signal used for capturing data is provided by the at least one memory device. The method further includes selecting a time delay from the time delays used in the memory access operations. Moreover, the method includes utilizing the selected time delay in performing subsequent memory access operations on the at least one memory device.

In another aspect, the present disclosure provides a method for tuning control signals associated with at least one memory device. The method includes generating a control signal by an integrated circuit, and sending the control signal to the at least one memory device. Further, the method includes routing the control signal to an input of the integrated circuit. Specifically, the routed control signal is used to capture data provided by the at least one memory device. Furthermore, the method includes performing memory access operations on the at least one memory device and recording results of the memory access operations. Particularly, the memory access operations are performed with different time delays for a first edge of the routed control signal so as to vary times for capturing the data provided during the memory access operations. Moreover, the method includes selecting a time delay from the time delays used with the routed control signal. Additionally, the method includes utilizing the selected time delay for the routed control signal in performing subsequent memory access operations on the at least one memory device.

In yet another aspect, the present disclosure provides a system including at least one memory device and an integrated circuit operatively coupled to the at least one memory device. The integrated circuit includes a circuitry for performing a number of memory access operations on the at least one memory device and recording results of the memory access operations. Specifically, the memory access operation may be performed with different time delays for a first edge of a control signal such that the control signal is used for capturing data provided by the at least one memory device. Further, the circuitry of the integrated circuit is capable of selecting a time delay from the time delays used in the memory access operations and utilizing the selected time delay in performing subsequent memory access operations on the at least one memory device.

BRIEF DESCRIPTION OF THE DRAWINGS

The above-mentioned and other features and advantages of this present disclosure, and the manner of attaining them, will become more apparent and the present disclosure will be better understood by reference to the following description of embodiments of the disclosure taken in conjunction with the accompanying drawings, wherein.

DETAILED DESCRIPTION

Figure 1:
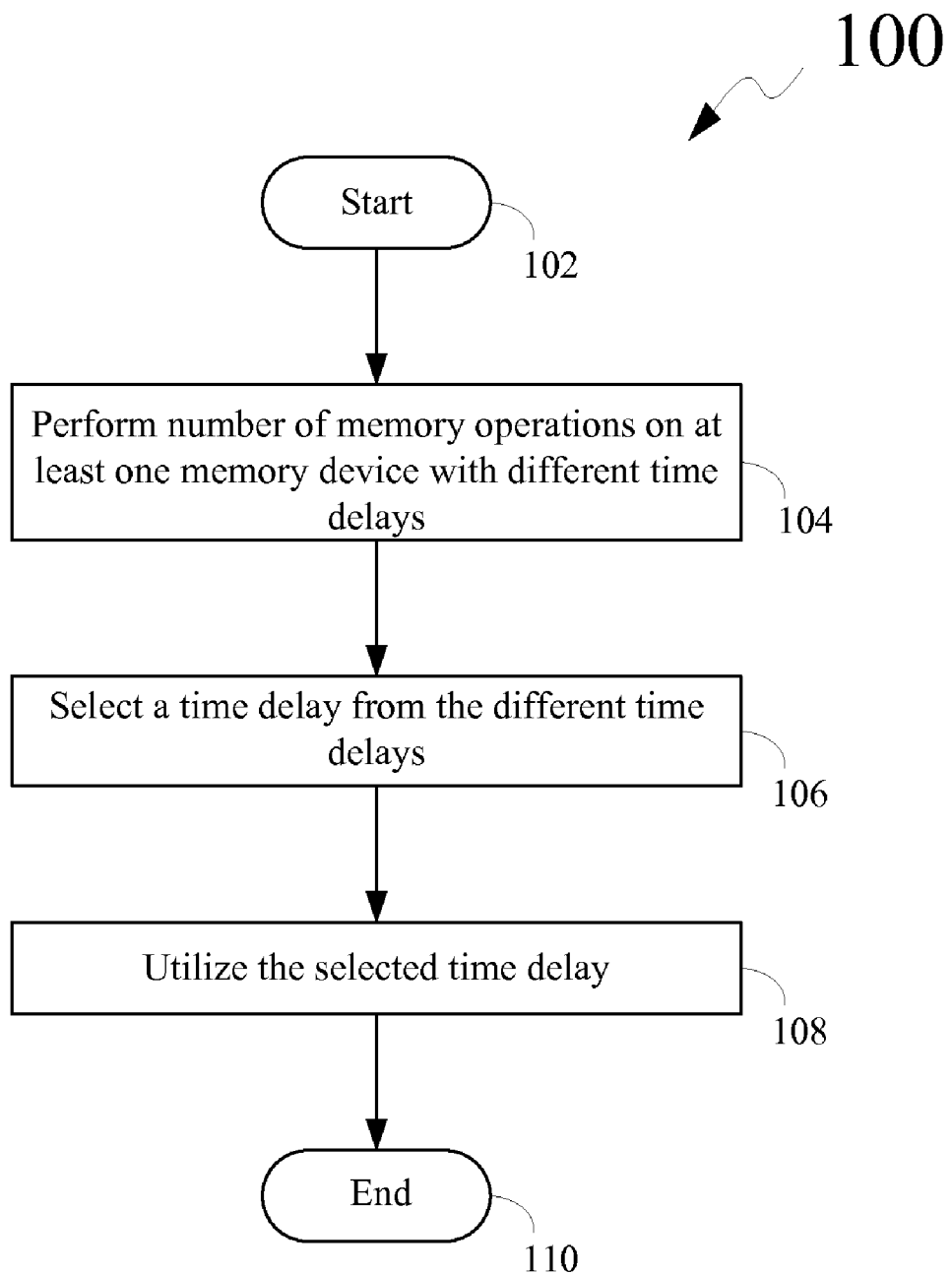
FIG. 1 is a flow diagram depicting a method for tuning a control signal associated with at least one memory device, in accordance with an exemplary embodiment of the present disclosure.

It is to be understood that the present disclosure is not limited in its application to the details of construction and the arrangement of components set forth in the following description or illustrated in the drawings. The present disclosure is capable of other embodiments and of being practiced or of being carried out in various ways. Also, it is to be understood that the phraseology and terminology used herein is for the purpose of description and should not be regarded as limiting. The use of "including" "comprising" or "having" and variations thereof herein is meant to encompass the items listed thereafter and equivalents thereof as well as additional items.

In addition, it should be understood that embodiments of the present disclosure include both hardware and electronic components or modules that, for purposes of discussion, may be illustrated and described as if the majority of the components were implemented solely in hardware. However, one of ordinary skill in the art, and based on a reading of this detailed description, would recognize that, in at least one embodiment, the electronic based aspects of the present disclosure may be implemented in software. As such, it should be noted that a plurality of hardware and software-based devices, as well as a plurality of different structural components may be utilized to implement the present disclosure. Furthermore, and as described in subsequent paragraphs, the specific mechanical configurations illustrated in the drawings are intended to exemplify embodiments of the present disclosure and that other alternative mechanical configurations are possible.

The present disclosure provides a method for tuning control signals associated with at least one memory device, such as a DDR SDRAM, a SDR SDRAM, and the like. Specifically, the control signals may be generated by the at least one memory device or a driving circuit (in an ASIC) interfaced to the at least one memory device for data exchange therebetween. The tuning of the control signals is carried out to meet the timing requirement of the at least one memory device. Specifically, the method described in the present disclosure tunes the control signals in a manner so as to account for real-time variation in an operating environment of the ASIC, such as a variation in an ambient temperature of the ASIC. The method for tuning the control signals will be described in conjunction with FIGS. 1 and 4.

Referring now to FIG. 1, a flow diagram depicting a method 100 for tuning a control signal associated with at least one memory device in a memory system is illustrated, in accordance with an embodiment of the present disclosure. In the described embodiment, the at least one memory device is a DDR SDRAM and accordingly, the control signal is a DQS signal. The memory system includes an integrated circuit such as a memory controller interfaced with the at least one memory device. The memory system will be described in detail in conjunction with FIG. 3. Further, the integrated circuit may be an ASIC. The ASIC may perform READ or WRITE operations on the at least one memory device. Specifically, the ASIC may generate the DQS signal during the WRITE operation. Further, the at least one memory device may generate the DQS signal during the READ operation. In the described embodiment, the DQS signal generated by the at least one memory, during a READ operation, is to be tuned to account for variations in operating environment of the ASIC. More specifically, the DQS signal is required to be delayed appropriately such that the ASIC is enabled to meet timing specification of the at least one memory device for enabling reading of error free data from the at least one memory device.

As shown in FIG. 1, method 100 starts at 102. At 102, a current operating temperature of the ASIC is measured. In an embodiment of the present disclosure, the current operating temperature may be an ambient temperature in the vicinity of the memory system. The measured current operating temperature is compared with a predetermined temperature range for the ASIC. The predetermined temperature range may be defined as range of temperature for which the ASIC is enabled to meet the timing specification of the at least one memory device, thereby enabling an error free data exchange therebetween. The predetermined temperature range may be experimentally determined and set during configuration of the memory system. Specifically, while the memory system is being configured with the ASIC and the at least one memory device, standard temperature testing may be performed on the memory system to determine the allowable drift in temperature that may be handled by the ASIC without requiring to change timing thereof for meeting the timing specification of the at least one memory device. The allowable drift may be utilized to determine the predetermined range of temperature.

Further, upon determining the measured current operating temperature to be outside the predetermined temperature range, the ASIC identifies a variation in the operating environment thereof. Accordingly, the ASIC identifies a need for tuning of the control signal for enabling error-free data exchange with the at least one memory device at the current operating temperature. Consequently, the ASIC generates a temperature interrupt to indicate the variation in the operating environment thereof. Upon generation of the temperature interrupt, global interrupts and direct memory access (DMA) of the memory system are disabled. Further, the ASIC flushes contents of a cache memory of the memory system and thereafter disables the cache memory. Furthermore, a firmware of the ASIC locks all resources of the memory system and stops all critical operation being performed by the ASIC until the control signal has been tuned. Moreover, the ASIC stops measuring the current operating temperature and responding to user inputs, such as commands from the user for memory access, until the tuning of the control signal has been performed.

To perform tuning of the control signal, the ASIC disables the temperature interrupt. Thereafter, method 100 performs a number of memory access operations, specifically WRITE operations and READ operations, on the at least one memory device, at 104. The number of memory access operations is performed for each of a rising edge and a falling edge of the control signal. Specifically, the number of memory access operations may be performed for each of rising edges and falling edges of the control signal by applying different time delays to the control signal, which will be explained herein. For the purpose of description of the present embodiment, method 100 will be described in conjunction with the rising edges of the control signal only. It will be apparent for a person skilled in the art to utilize method 100 for the falling edges of the control signal in a manner as described for the rising edge of the control signal. Further, subsequent to the performance of the number of memory access operations, the results of the memory access operations are recorded, which will be explained later.

As disclosed herein, in an embodiment of the present disclosure, the ASIC may initialize a first time delay and a second time delay to a predetermined threshold value thereof. The first time delay represents a time delay to be applied to the control signal for enabling tuning thereof and the second time delay represents a time delay provided by the ASIC for enabling data being exchanged with the at least one memory device to be synchronized with an internal circuitry of the ASIC. Specifically, the first time delay represents time delay values (which may be measured in picoseconds) that are used to delay the control signal for meeting the timing specifications of the at least one memory device. In an embodiment of the present disclosure, the range of values for the first time delay may range from 0 through 255, such that each range of value may represent a time delay between 50 and 150 picoseconds. Moreover, the second time delay represents time delay values by which the data (being exchanged with the at least one memory device) is delayed by the ASIC before being passed to the internal circuitry of the ASIC. In an embodiment of the present disclosure, range of values for the second time delay may be between 0 to 3 clock signals generated by the ASIC. The first time delay is used to appropriately tune the control signal for enabling error-free data exchange between the ASIC and the at least one memory device. Accordingly, method 100 applies different time delays by applying different values of the first time delay, as explained herein, for different values of second time delay to the control signal for performing the number of memory access operations. In an exemplary embodiment of the present disclosure, the predetermined threshold value of the first time delay may be around 50 pico-second (ps) and the predetermined threshold value of the second time delay may be about 0 ps.

The initialized value of the first time delay is applied to the control signal and a four word WRITE operation is performed by the ASIC at a known address of the at least one memory device. Specifically, the ASIC writes a sample four word data ("hereinafter referred to as "test data") at the known address of the at least one memory device at rising edges of the control signal. The control signal is delayed by the initialized value of the first time delay. Thereafter, the ASIC performs a READ operation from the known address of the at least one memory device at rising edges of the control signal. A data (hereinafter referred to as "read data") obtained from the known address, upon performing the READ operation, is compared with the test data. Specifically, the ASIC determines if the read data is same as the test data to identify that an error-free data exchange has been enabled with the at least one memory device. Upon determining the read data to be same as the test data, the ASIC identifies that the initialized value of the first time delay is valid value thereof. The term "valid values" refer to the values of the first time delay, which when applied to the control signal enable error free data exchange between the ASIC and the at least one memory device. Specifically, the ASIC maintains a "Valid Settings Table" which is adapted to store all valid values of the first time delay along with a corresponding value of the second time delay and information regarding whether the valid values of the first time delay was obtained for the rising edges or the falling edges of the control signal. In the present embodiment, it is assumed that the read data is same as the test data and accordingly, the initialized values of the first time delay is stored in the valid settings table. The initialized values of the first time delay that is stored as valid value in the valid settings table may be identified as the result of the memory access operations.

Further, the ASIC determines other valid values of the first time delay for different values of the second time delay by incrementing the initialized value of at least one of the first time delay and the second time delay by predetermined numbers until a maximum value thereof is achieved. Specifically, the second time delay signal may be incremented from 0 to 3 clock signals and the first time delay may be incremented from 0 to 255. For example, in a first pass of method 100, the ASIC may keep the initialized value of the first time delay unchanged while the initialized value of the second time delay is incremented by predetermined numbers (which is one clock signal) until a maximum value (3 clock signals) of the second time delay is achieved. Each value of the second time delay obtained by incrementing the initialized value thereof by the predetermined numbers may be referred to as "incremented value of the second time delay". Thereafter, valid values of the first time delay are determined for each incremented value of the second time delay. Specifically, the ASIC, for each incremented value of the second time delay, applies the initialized value of the first time delay to the control signal. Consequently, the control signal is delayed such that the delayed control signal is used to write the test data to the known address of the at least one memory device and obtain the read data from the known address thereof at rising edges of the control signal. The ASIC identifies the valid values of the first time delay for each of the incremented values of the second time delay based on the read data being the same as the test data. The valid values of the first time delay are stored in the valid settings table along with the corresponding incremented value of the second time delay. The information regarding the valid values of the first time delay being obtained at the rising edges of the control signal is also stored along with the corresponding valid values of the first time delay. The stored valid values of the first time delay in the valid settings table may be identified as results of the number of memory access operations carried out by the ASIC on the at least one memory device.

Thereafter, the ASIC increments the initialized value of the first time delay by a predetermined number (between 0 to 255) in each subsequent first pass and determines valid values of the first time delay for different values (ranging between 0 to 3 clock signals) of the second time delay in a manner similar to as described in conjunction with the first pass. The valid values of the first time delay are obtained for the rising edge of the control signal. The valid values of the first time delay for different values of the second time delay are stored in the valid settings table along with the information regarding the valid values of the first time delay being obtained for the rising edges of the control signal.

In a second pass of method 100, valid values of the first time delay are determined for the falling edges of the control signal in a manner described above for the rising edges of the control signal. The valid values of the first time delay are stored in the valid settings table. The information regarding the valid values of the first time delay being obtained at the falling edges of the control signal is also stored along with the corresponding valid values in the valid settings table.

Accordingly, the valid settings table is populated with all valid values of the first time delay obtained for different values (ranging between 0 to 3 clock signals) of the second time delay at each of the rising edges and the falling edges of the control signal. Specifically, the valid values in the valid settings table may be grouped based on the second time delay and the information regarding whether the valid values are obtained for the rising edges or the falling edges of the control signal. Such information may be hereinafter referred to as 'phase control parameter". The valid values of the first time delay may be arranged in a plurality of sets such that each set includes a particular number of valid values of the first time delay. The arrangement of the valid values of the first time delay in the plurality of sets may be explained with the help of an example. For example, in the present embodiment, the second time delay has four values ranging between 0 to 3 clock signals and the phase control parameter has two values (representing the rising edges and the falling edges of the control signal). As explained herein, each valid value of the first time delay has a corresponding value of the second time delay and the phase control parameter. Accordingly, the valid values of the first time delay may be arranged in eight different sets such that each set is identified based on a particular value of the second time delay and the phase control parameter. Each set of valid values of the first time delay may include between 1 to 255 first time delay values. The determination of the valid values of the first time delay for populating the valid settings table therewith will be explained in detail in conjunction with FIG. 2.

Upon populating the valid settings table, method 100 performs selection of a desired first time delay (hereinafter referred to as "desired valid value") from the valid settings table, at 106. Specifically, as explained in conjunction with present embodiment, the valid values of the first time delay in the valid settings table are arranged in eight sets. Method 100 parses the valid values of the first time delay in each of the eight sets in the valid settings table to select a particular set that includes a maximum number of valid values of the first time delay therein. Thereafter, the desired valid value is obtained from the selected set based on the number of valid values in the selected set. In an embodiment of the present disclosure, if the number of valid values in the selected set is N, then the desired valid value is selected as the (N/2)+1 value of the selected set when N is even. The desired valid value is selected as the (N+1)/2 value of the selected set when N is odd.

Upon selection of the desired valid value from the valid settings table, the desired valid value is utilized to delay the control signal for enabling the ASIC to capture data from the at least one memory device, at 108. Specifically, the desired valid value is used by the ASIC to delay the control signal for all subsequent memory access operations, such as the READ operation and the WRITE operation with the at least one memory device. Accordingly, the ASIC utilizes the desired valid value to tune the control signal for enabling an error-free data exchange with the at least one memory device. Thereafter, method 100 terminates at 110. Specifically, at 110, the temperature interrupt is re-enabled. Furthermore, the contents of the cache memory, which were flushed previously, are restored therein and the cache memory is enabled for further use. Moreover, the ASIC enables the global interrupts and the DMA of the memory system. Additionally, the locked resources of the memory system are unlocked for use thereof. Also, the ASIC redefines the predetermined temperature range based on the measured current operating temperature.

As explained herein, the predetermined temperature range includes a range of temperatures for which the ASIC is enabled to meet the timing specification of the at least one memory device. Since, in the described embodiment, the DQS signal has been tuned based on the measured current operating temperature, a new predetermined temperature range may be determined that is centered at the measured current operating temperature. For example, it may be determined experimentally that the ASIC is able to meet the timing specification up to +/−5° C. variation in the measured current operating temperature. Accordingly, the new predetermined temperature range may be ranging from (measured current operating temperature −5° C.) to (measured current operating temperature +5° C.) such that the new predetermined temperature range is centered at the measured current operating temperature. For any variation in the measured current operating temperature within the new predetermined temperature range, the DQS signal is not required to be re-tuned. Alternatively, if the measured current operating temperature varies out of the new predetermined temperature range, the ASIC reinitiates method 100 to retune the DQS signal for meeting the timing specification of the at least one memory device.

Figure 2:
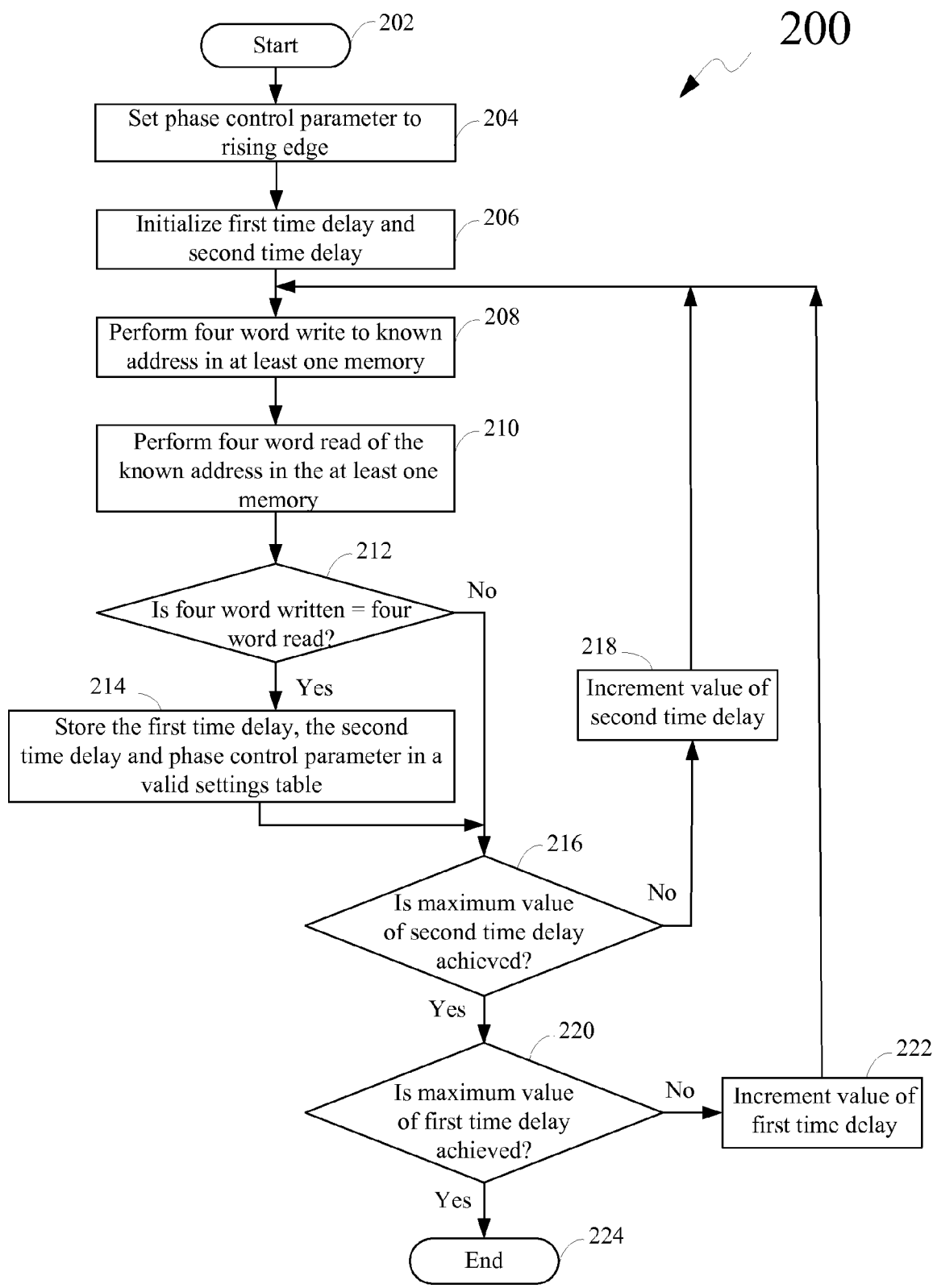
FIG. 2 is a flow diagram depicting a method for determination of valid values of a first time delay and a second time delay in the method of FIG. 1, in accordance with an exemplary embodiment of the present disclosure.

Referring now to FIG. 2, a flow diagram depicting a method 200 for determination of valid values of the first time delay for different values of the second time delay is illustrated, in accordance with an embodiment of the present disclosure. Method 200 is adapted to determine the valid values for both the rising edges and falling edges of the control signal. However, for sake of brevity, method 200 will be explained for the rising edges of the control signal only. Method 200 commences at 202. At 202 the ASIC may determine a need for tuning the control signal based on the measured current operating temperature. Further, method 200 sets a phase control parameter to identify whether method 200 is being performed for the rising edges or the falling edges of the control signal. More specifically, the phase control parameter is set, at 204, to a particular value to identify that the method 200 is being performed for the rising edges of the control signal. Thereafter, method 200 performs initialization of the first time delay and the second time delay, at 206. Further, method 200 writes a four word data (referred to as the "test data") at the known location of the at least one memory device, at 208. Method 200 further reads data (referred to as the "read data") from the known address at 210. The test data is compared with read data at 212. Specifically, upon determining that the read data is same as the test data, method 200 stores the initialized values of the first time delay in the valid settings table along with the corresponding initialized second time delay and the corresponding phase control parameter, at 214. Thereafter, method 200 proceeds to 216. Alternatively, upon determining, at 212, that the read data is not same as the test data, method 200 proceeds directly to 216.

Specifically, at 216, method 200 determines whether a maximum value for the second time delay is achieved. Upon determining, at 216, that the maximum value for the second time delay is not achieved, method 200 increments the value of the second time delay by a predetermined number (one clock signal), at 218, and a "second time delay pass" of method 200 is initiated. For the sake of explanation of the "second time delay pass", the acts at 208, 210, 212, 214, 216 and 218 may be collectively referred to as "acts of determining valid values". Specifically, method 200 repeats the "acts of determining valid value" in the "second time delay pass" with the initialized value of the first time delay to identify whether the first time delay is a valid value. Method 200 increments the value of the second time delay for each subsequent "second time delay pass" until the maximum value (3 clock signals) of the second time delay is achieved. The "acts of determining valid value" are performed in each subsequent "second time delay pass" by utilizing the initialized value of the first time delay. Accordingly, valid values of the first time delay are identified for each subsequent "second time delay pass". The valid values of the first time delay are stored in the valid settings table along with the corresponding values of the second time delay and the corresponding phase control parameter.

Upon achieving the maximum value of the second time delay, at 200, method 200 determines, at 220, that whether a maximum value (which is 255) of the first time delay is achieved. The value of the first time delay is incremented, at 222, when it is determined that the maximum value of the first time delay is not achieved. Thereafter, a number of "second time delay pass" are performed with the incremented value of the first time delay in a "first time delay pass". The number of "second time delay pass" is performed for the range of values of the second time delay, i.e. between 0 to 3 clock signals. Upon completion of the "first time delay pass', the valid values of the first time delay are identified and stored in the valid settings table along with the corresponding value of the second time delay and the phase control parameter. A number of subsequent "first time delay pass" iterations may be performed until the maximum value of the first time delay is achieved. Accordingly, based on the number of subsequent "first time delay pass" iterations, the valid settings table is populated with valid values of the first time delay along with corresponding values of the second time delay for the rising edge of the control signal.

Method 200 stops at 224 when it is determined that the maximum value of the first time delay is achieved. At 224, method 200 may set the phase control parameter to falling edge and method 200 may repeat from 206 to determine valid values of the first time delay for the falling edge of the control signal. Accordingly, the valid settings table is populated with valid values of the first time delay and the corresponding values of the second time delay for the falling edge of the control signal.

The valid settings table may be parsed, as described in conjunction with method 100, to determine the desired valid value for tuning of the control signal.

Figure 3:
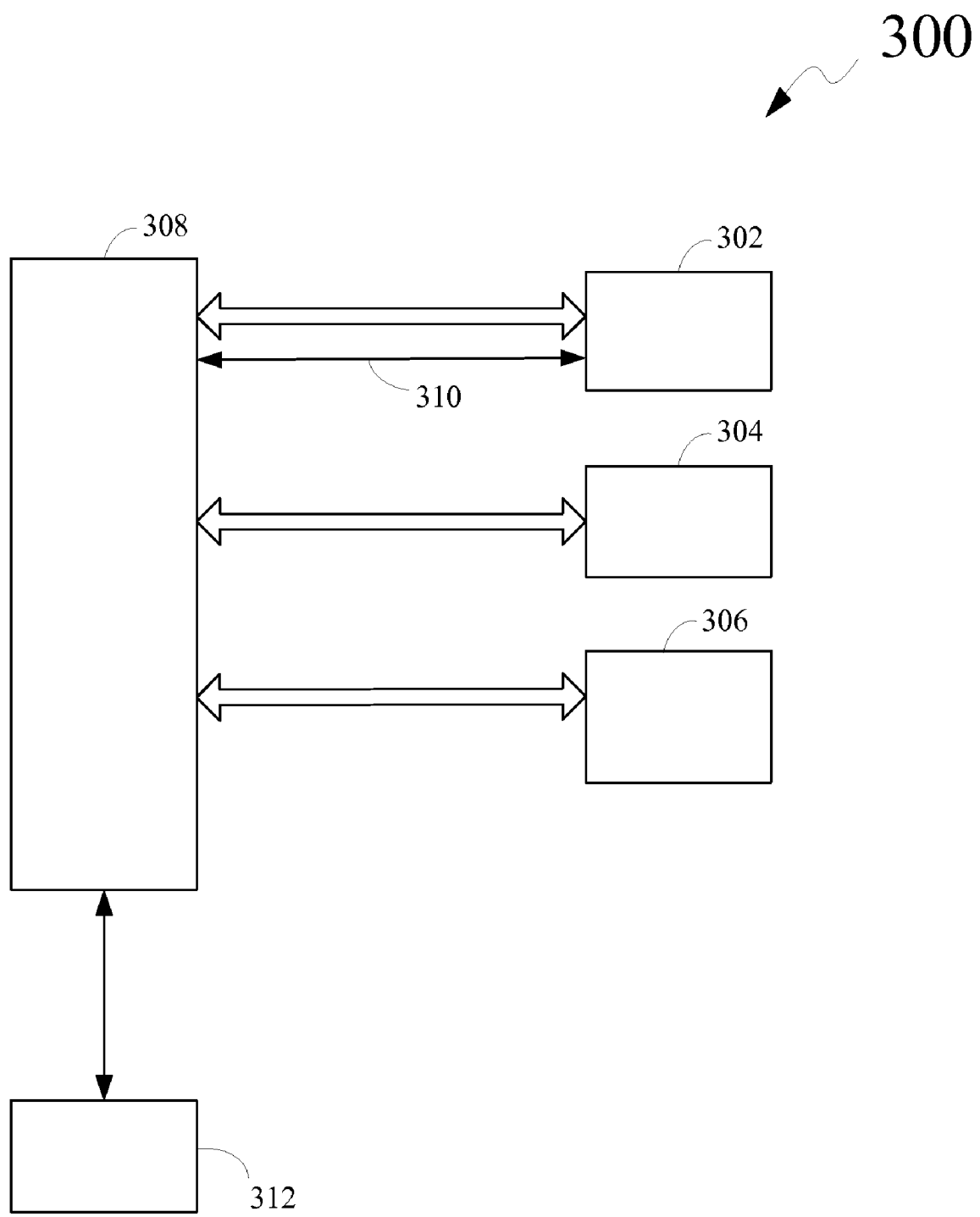
FIG. 3 is a block diagram of a memory system in which the method of FIG. 1 is utilized, in accordance with an exemplary embodiment of the present disclosure.

Referring now to FIG. 3, a memory system 300 utilizing method 100 therein will be described. Specifically, memory system 300 includes at least one memory device, such as a memory device 302, a memory device 304, a memory device 306, and the like and an integrated circuit, such as an ASIC 308, operatively coupled to the at least one memory device. It will be evident to a person skilled in the art that memory system 300 may include a plurality of memory devices, such as memory device 302, memory device 304, and memory device 306 depending upon a maximum number of memory devices that may be supported by ASIC 308. However, for the sake of explanation of the present disclosure, reference will be made to ASIC 308 and only one memory device, such as memory device 302.

Further, Memory system 300 includes a bi-directional control line 310 apart from data lines (not shown) configured between ASIC 308 and memory device 302 for exchange of the control signal therebetween. In the present embodiment of the present disclosure, memory device 302 is a DDR SDRAM and accordingly, the control signal is a DQS signal. The DQS signal may be generated by memory device 302 during a READ operation for enabling ASIC 308 to read data from memory device 302. Further, ASIC 308 generates the DQS signal during a WRITE operation for writing data on memory device 302. As explained herein, ASIC 308 is required to tune the control signal to account for real-time variations in operating environment thereof, such as a variation in an ambient temperature. Such tuning enables error-free data exchange between ASIC 308 and memory device 302 even when the operating environment of ASIC 308 has changed.

Memory system 300 further includes a circuitry 312 for measuring the current operating temperature. Circuitry 312 is operatively coupled to ASIC 308. In an embodiment of the present disclosure, the circuitry for measuring the current operating temperature may be a temperature sensor. Based on the measurement of the current operating temperature, ASIC 308 determines whether tuning of the control signal is required and initiates method 100, as described in conjunction with FIG. 1.

Figure 4:
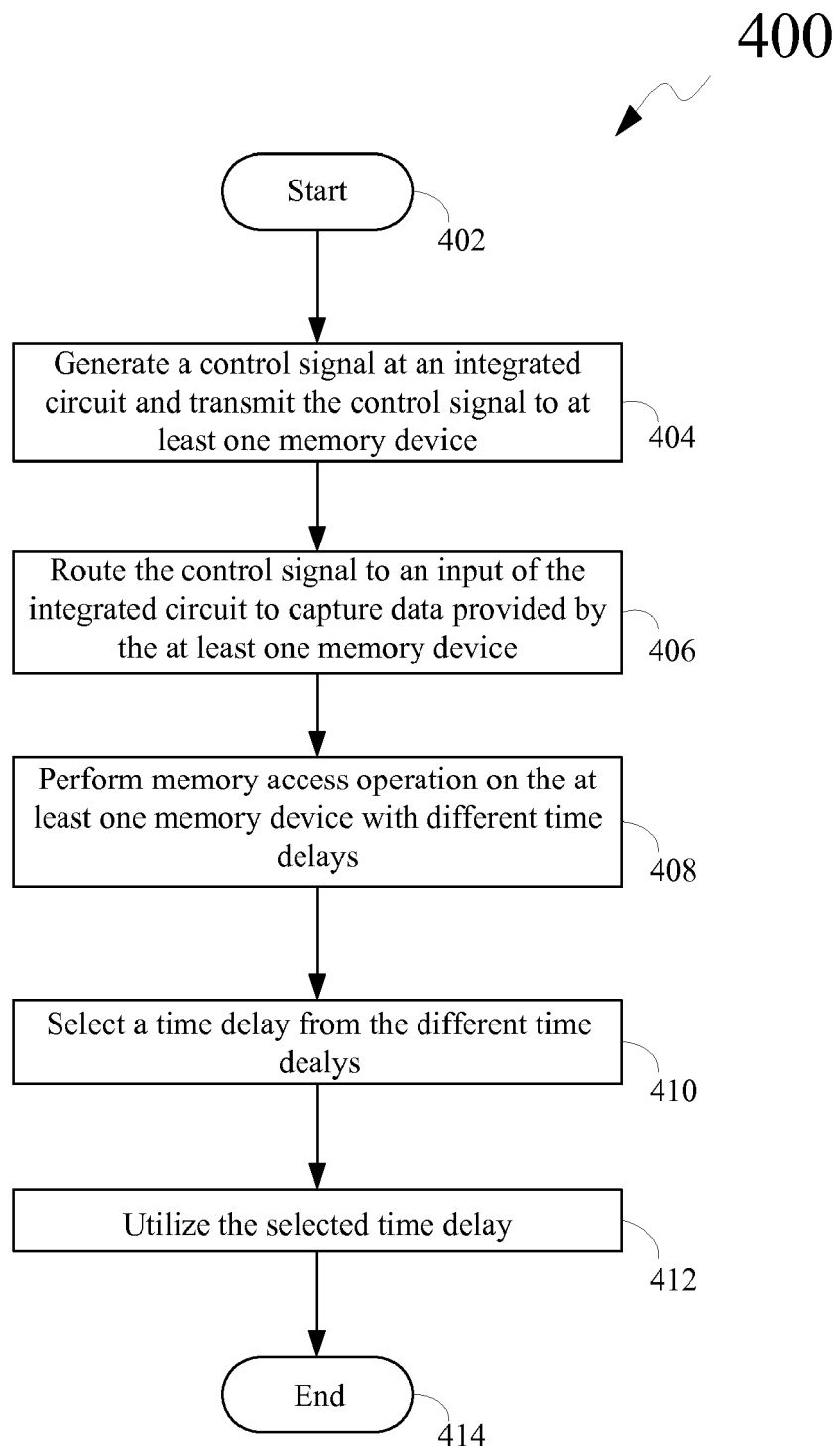
FIG. 4 is a flow diagram depicting a method for tuning a control signal associated with at least one memory device, in accordance with another exemplary embodiment of the present disclosure.

As described above, ASIC 308 allows for the retuning of the timing for the DQS control signal upon the affirmative detection of an operating temperature being outside of a predetermined operating temperature range. ASIC 308 may also use the same circuitry and functionality to tune other control signals associated with other types of memory devices with which ASIC 308 may exchange data. Referring now to FIG. 4, a flow diagram depicting a method 400 for tuning a control signal associated with at least one memory device in a memory system is illustrated, in accordance with another embodiment of the present disclosure. The memory system includes an integrated circuit, such as an ASIC, operatively coupled to the at least one memory device. In this embodiment, the ASIC may be ASIC 308 configured to tune a memory device that utilizes a DQS signal for exchanging data with ASIC 308, as explained above. However, in this embodiment, the at least one memory device utilized in the memory system is a SDR SDRAM. Since SDR SDRAMs do not utilize a DQS signal, the control signal as utilized herein refers to a clock signal generated by the ASIC. Accordingly, the present embodiment relates to tuning of the clock signal of the ASIC for enabling error-free data exchange between the ASIC and the at least one memory device even when an operating environment of the ASIC varies. Specifically, in the present embodiment, prior to implementation of the method 400, the clock signal of the ASIC may be routed back to a DQS input terminal of the ASIC to generate a routed control signal. In effect, the routed control signal is a delayed clock signal. By routing the ASIC clock output signal to the DSQ input terminal of the ASIC, the ASIC is able to use its circuitry associated with the DQS signal tuning function to tune the clock signal for substantially eliminating data exchange errors.

Method 400 starts at 402. At 404, the ASIC generates the control signal that is provided to the at least one memory device. The generated control signal, at 404, is routed back to an input, such as the DQS input terminal, of the ASIC. The routed control signal may be used for capturing data from the at least one memory device. Specifically, since the clock output signal is used to control the exchange of data with the memory device, the routed control signal is itself used as a clock signal of the ASIC whose timing may be selectively delayed in a manner such that rising edges of the routed clock signal are aligned at center of the data signal from the at least one memory device for capture by the ASIC, thereby meeting the timing specification of the at least one memory.

Further, method 400 performs tuning of the routed control signal. Specifically, at 406, method 400 performs a number of memory access operations, specifically WRITE operations and READ operations, on the at least one memory device by utilizing the routed control signal. Subsequently, results of the memory access operations are recorded, which will be explained later. The number of memory access operations is performed for each of a rising edge and a falling edge of the routed control signal. Specifically, the number of memory access operations may be performed for each of a rising edge and a falling edge of the routed control signal by applying different time delays thereto, which will be explained herein.

For the purpose of description of the present embodiment, method 400 will be described in conjunction with the rising edge of the routed control signal only. It will be apparent for a person skilled in the art to utilize method 400 for the falling edge of the routed control signal in a manner as described for the rising edge of the routed control signal.

As disclosed herein, in an embodiment of the present disclosure, the ASIC may initialize a first time delay and a second time delay to a predetermined threshold value thereof. The first time delay represents a time delay to be applied to the routed control signal for enabling tuning thereof and the second time delay represents a time delay provided by the ASIC for enabling data being exchanged with the at least one memory device to be synchronized with an internal circuitry of the ASIC. Specifically, the first time delay represents time delay values (which may be measured in picoseconds) that are used to delay the routed control signal for meeting the timing specifications of the at least one memory device. In an embodiment of the present disclosure, the range of values for the first time delay may range from 0 through 255, such that each range of value may represent a time delay between 50 and 150 picoseconds. Moreover, the second time delay represents time delay values by which the data (being exchanged with the at least one memory device) is delayed by the ASIC before being passed to the internal circuitry of the ASIC. In an embodiment of the present disclosure, range of values for the second time delay may be between 0 to 3 clock signals generated by the ASIC. The first time delay is used to appropriately tune the routed control signal for enabling error-free data exchange between the ASIC and the at least one memory device. Accordingly, method 400 applies different time delays by applying different values of the first time delay for different values of second time delay to the routed control signal for performing the number of memory access operations. In an exemplary embodiment of the present disclosure, the predetermined threshold value of the first time delay may be around 50 pico-second (ps) and the predetermined threshold value of the second time delay may be about 0 ps.

The initialized value of the first time delay is applied to the routed control signal and a four word WRITE operation is performed by the ASIC at a known address of the at least one memory device. Specifically, the ASIC writes a sample four word data ("hereinafter referred to as "test data") at the known address of the at least one memory device at rising edges of the routed control signal. The routed control signal is delayed by the initialized value of the first time delay. Thereafter, the ASIC performs a READ operation from the known address of the at least one memory device at rising edges of the routed control signal. A data (hereinafter referred to as "read data") obtained from the known address, upon performing the READ operation, is compared with the test data. Specifically, the ASIC determines if the read data is same as the test data to identify that an error-free data exchange has been enabled with the at least one memory device. Upon determining the read data to be same as the test data, the ASIC identifies that the initialized value of the first time delay is valid values thereof. The term "valid values" refer to the value of the first time delay, which when applied to the routed control signal enable error free data exchange between the ASIC and the at least one memory device. Specifically, the ASIC maintains a "Valid Settings Table" which is adapted to store all valid values of the first time delay along with a corresponding value of the second time delay and information regarding whether the valid values of the first time delay was obtained for the rising edges or the falling edges of the routed control signal. In the present embodiment, it is assumed that the read data is same as the test data and accordingly, the initialized values of the first time delay is stored in the valid settings table. The initialized values of the first time delay are stored as valid values in the valid settings table may be identified as the results of the memory access operations.

Further, the ASIC determines other valid values of the first time delay for different values of the second time delay by incrementing the initialized value of the at least one of the first time delay and the second time delay by predetermined numbers until a maximum value thereof is achieved. Specifically, the second time delay signal may be incremented from 0 to 3 clock signals and the first time delay may be incremented from 0 to 255. For example, in a first pass of method 400, the ASIC, while keeping the initialized value of the first time delay unchanged, may increment the initialized value of the second time delay by predetermined numbers (which is one clock signal). The initialized value of the second time delay may be incremented until a maximum value (3 clock signals) of the second time delay is achieved. Each value of the second time delay obtained by incrementing the initialized value thereof may be referred to as "incremented value of the second time delay". Thereafter, valid values of the first time delay are determined for each incremented value of the second time delay. Specifically, the ASIC, for each incremented value of the second time delay, applies the initialized value of the first time delay to the routed control signal. Consequently, the routed control signal is delayed such that the delayed routed control signal is used to write the test data to the known address of the at least one memory device and obtain the read data from the known address thereof at rising edges of the routed control signal. The ASIC identifies the valid values of the first time delay for each of the incremented values of the second time delay based on the read data being same as the test data. The valid values of the first time delay are stored in the valid settings table along with the corresponding incremented value of the second time delay. The information regarding the valid values of the first time delay being obtained at the rising edges of the control signal is also stored along with the corresponding valid values of the first time delay. The stored valid values of the first time delay in the valid settings table may be identified as results of the number of memory access operations carried out by the ASIC on the at least one memory device.

Thereafter, the ASIC increments the initialized value of the first time delay by a predetermined number (between 0 to 255) in each subsequent first pass and determines valid values of the first time delay for different values (ranging between 0 to 3 clock signals) of the second time delay in a manner similar to as described in conjunction with the first pass of method 400. The valid values of the first time delay are obtained for the rising edge of the control signal. The valid values of the first time delay for different values of the second time delay are stored in the valid settings table along with the information regarding the valid values of the first time delay being obtained for the rising edges of the routed control signal.

In a second pass of method 400, valid values of the first time delay are determined for the falling edges of the routed control signal in a manner described above for the rising edges of the routed control signal. The valid values of the first time delay are stored in the valid settings table. The information regarding the valid values of the first time delay being obtained at the falling edges of the routed control signal is also stored along with the corresponding valid values in the valid settings table.

Accordingly, the valid settings table is populated with all valid values of the first time delay obtained for different values (ranging between 0 to 3 clock signals) of the second time delay at each of the rising edges and the falling edges of the routed control signal. Specifically, the valid values in the valid settings table may be grouped based on the second time delay and the information regarding whether the valid values are obtained for the rising edges or the falling edges of the routed control signal. Such information may be hereinafter referred to as 'phase control parameter". The valid values of the first time delay may be arranged in a plurality of sets, as explained in conjunction with method 100. The determination of the valid values of the first time delay for populating the valid settings table is performed in a manner similar to explained in conjunction with method 200.

Upon populating the valid settings table, method 400 performs selection of a desired first time delay (hereinafter referred to as "desired valid value") from the valid settings table, at 410. Specifically, as explained herein, the valid values of the first time delay may be arranged in the plurality of sets such that each set includes a particular number of valid values. Method 400 parses the valid values of the first time delay in the valid settings table to select a particular set from the plurality of sets such that the selected set includes maximum number of valid values of the first time delay therein. Thereafter, the desired valid value is obtained from the selected set based on the number of valid values in the selected set. In an embodiment of the present disclosure, if the number of valid values in the selected set is N, then the desired valid value is selected as the (N/2)+1 value of the selected set when N is even. The desired valid value is selected as the (N+1)/2 value of the selected set when N is odd.

Upon selection of the desired valid value from the valid settings table, the desired valid value is utilized to delay the routed control signal for enabling the ASIC to capture data from the at least one memory device, at 412. Specifically, the desired valid value is used by the ASIC to delay the routed control signal for all subsequent memory access operations, such as the READ operation and the WRITE operation with the at least one memory device. Accordingly, the ASIC utilizes the desired valid value to tune the routed control signal for enabling an error-free data exchange with the at least one memory device. The acts 408 through 412 for tuning of the routed control signals may be collectively referred to as "acts of tuning". Method 400 terminates at 414 such that the ASIC has determined the desired valid delay for tuning of the routed control signal.

Further, upon tuning the routed control signal, a current operating temperature of the ASIC may be determined. In an embodiment of the present disclosure, the current operating temperature may be an ambient temperature in the vicinity of the memory system. The measured current operating temperature is compared with a predetermined temperature range for the ASIC. The predetermined temperature range may be defined as a range of temperature for which the ASIC is enabled to meet the timing specification of the at least one memory device, thereby enabling an error free data exchange therebetween. Upon determining the measured current operating temperature to be outside the predetermined temperature range, the ASIC identifies a variation in the operating environment thereof. Accordingly, the ASIC identifies a need for re-tuning of the routed control signal for enabling error-free data exchange with the at least one memory device. Subsequently, the ASIC generates a temperature interrupt to indicate the variation in the operating environment thereof. Upon generation of the temperature interrupt, global interrupts and direct memory access (DMA) of the memory system are disabled. Further, the ASIC flushes contents of a cache memory of the memory system and thereafter disables the cache memory. Furthermore, a firmware of the ASIC locks all resources of the memory system and stops all critical operation being performed by the ASIC until the routed control signal has been re-tuned. Moreover, the ASIC stops measuring the current operating temperature and responding to user inputs, such as commands for memory access, until the re-tuning of the routed control signal has been performed To re-tune the routed control signal, the "acts of tuning" are re-performed to determine a new time delay for the routed control signal at the current operating temperature. Specifically, the "acts of tuning may be re-performed to determine a new desired valid value at the current operating temperature. Accordingly, the new time delay may be referred to as the new desired valid value. The new desired valid value may be applied to the routed control signal for performing re-tuning thereof such that the re-tuned routed control signal enables error-free data exchange with the at least one memory device even when the operating environment of the ASIC has changed. Specifically, the re-tuned control signal enables the ASIC to perform subsequent memory access operations on the at least one memory device at the current operating temperature, which is outside the predetermined temperature range of the ASIC.

Further, after selection of the new desired valid value, the temperature interrupt is re-enabled. Furthermore, the contents of the cache memory, which were flushed previously, are restored therein and the cache memory is enabled for further use. Moreover, the enables the global interrupts and the DMA of the memory system. Additionally, the locked resources of the memory system are unlocked for use thereof. Also, the ASIC redefines the predetermined temperature range based on the measured current operating temperature. As explained herein, the predetermined temperature range includes a range of temperatures for which the ASIC is enabled to meet the timing specification of the at least one memory device. Since, in the described embodiment, the routed control signal has been tuned based on the measured current operating temperature, a new predetermined temperature range may be determined that is centered at the measured current operating temperature. For example, it may be determined experimentally that the ASIC is able to meet the timing specification up to +/−5° C. variation in the measured current operating temperature. Accordingly, the new predetermined temperature range may be ranging from (measured current operating temperature −5° C.) to (measured current operating temperature +5° C.) such that the new predetermined temperature range is centered at the measured current operating temperature. For any variation in the measured current operating temperature within the new predetermined temperature range, the routed control signal is not required to be re-tuned. Alternatively, if the measured current operating temperature varies out of the new predetermined temperature range, the ASIC reinitiates method 400 to retune the routed control signal for meeting the timing specification of the at least one memory device.

The methods, such as method 100 and method 400, for tuning of the control signal, as disclosed herein, effectively enable delaying the control signal such that an error-free data exchange is enables between the ASIC and the at least one memory device. Further, the present disclosure provides a programmable time delay to the control signal, thereby enabling the ASIC to suitably adapt to variations in the operating environment, such as the current operating temperature, thereof. Furthermore, the present disclosure may be implemented without requiring any substantial hardware circuitry and accordingly, a suitable time delay for the control signal may be easily generated.

The foregoing description of several methods and an embodiment of the present disclosure have been presented for purposes of illustration. It is not intended to be exhaustive or to limit the present disclosure to the precise steps and/or forms disclosed, and obviously many modifications and variations are possible in light of the above description. It is intended that the scope of the present disclosure be defined by the claims appended hereto.

What is claimed is:

1. A method for tuning control signals associated with at least one memory device, comprising:
    performing a number of memory access operations on the at least one memory device, the memory access operation being performed with different time delays for a first edge of a control signal, the control signal used for capturing data provided by the at least one memory device, and recording results of the memory access operations;
    selecting a time delay from the time delays used in the memory access operations;
    utilizing the selected time delay in performing subsequent memory access operations on the at least one memory device; and
    prior to performing, measuring the current operating temperature; and refraining from further current operating temperature measurements until the time delay for the control signal is selected.

2. The method of claim 1, wherein the memory access operations are performed with different time delays for a second edge of the control signal, the selecting further comprises selecting a time delay from the time delays used for the second edge of the control signal, and the utilizing further comprises utilizing the selected time delay for the second edge of the control signal in performing subsequent memory access operations on the at least one memory device.

3. The method of claim 1, wherein performing the memory access operations is responsive to an indication that a current temperature is outside a predetermined temperature range.

4. The method of claim 3, further comprising: prior to performing, measuring the current operating temperature; and following selecting the time delay for the control signal, redefining the predetermined temperature range based upon the measured current operating temperature.

5. The method of claim 3, further comprising: prior to performing, suspending responding to user input until the time delay for the control signal is selected.

6. The method of claim 3, further comprising: prior to performing, flushing and disabling a cache; and restoring previous contents of and enabling the cache following selection of the time delay.

7. The method of claim 1, wherein the control signal is generated by an integrated circuit and is an input of the at least one memory device, and wherein the method further comprises: routing the control signal to an input of the integrated circuit.

8. A method for tuning control signals associated with at least one memory device, comprising:
    generating, by an integrated circuit, a control signal and sending the control signal to the at least one memory device;
    routing the control signal to an input of the integrated circuit, the routed control signal being used to capture data provided by the at least one memory device;
    performing memory access operations on the at least one memory device, the memory access operations being performed with different time delays for a first edge of the routed control signal so as to vary times for capturing the data provided during the memory access operations, and recording results of the memory access operations;

selecting a time delay from the time delays used with the routed control signal;

utilizing the selected time delay for the routed control signal in performing subsequent memory access operations on the at least one memory device; determining that a current operating temperature is outside of a predetermined temperature range;

responsive to the determination, repeating performing the memory access operations on the at least one memory device and selecting a new time delay for the routed control signal;

utilizing the selected new time delay for the routed control signal in subsequent memory access operations on the at least one memory device;

prior to determining, measuring the current operating temperature; and refraining from further operating temperature measurements until after the new time delay for the routed control signal is selected.

9. The method of claim 8, further comprising performing the memory access operations with different time delays for a second edge of the routed control signal, recording results of the memory access operations, selecting a time delay from the time delays of the second edge of the routed control signal, and utilizing the selected time delay for the routed control signal in performing subsequent memory access operations on the at least one memory device.

10. A method for tuning control signals associated with at least one memory device, comprising:

generating, by an integrated circuit, a control signal and sending the control signal to the at least one memory device;

routing the control signal to an input of the integrated circuit, the routed control signal being used to capture data provided by the at least one memory device;

performing memory access operations on the at least one memory device, the memory access operations being performed with different time delays for a first edge of the routed control signal so as to vary times for capturing the data provided during the memory access operations, and recording results of the memory access operations;

selecting a time delay from the time delays used with the routed control signal;

utilizing the selected time delay for the routed control signal in performing subsequent memory access operations on the at least one memory device;

determining that a current operating temperature is outside of a predetermined temperature range;

responsive to the determination, repeating performing the memory access operations on the at least one memory device and selecting a new time delay for the routed control signal;

utilizing the selected new time delay for the routed control signal in subsequent memory access operations on the at least one memory device; and prior to determining, measuring the current operating temperature; and following selecting the new time delay for the routed control signal, redefining the predetermined temperature range based upon the measured current operating temperature.

11. A method for tuning control signals associated with at least one memory device, comprising:

generating, by an integrated circuit, a control signal and sending the control signal to the at least one memory device;

routing the control signal to an input of the integrated circuit, the routed control signal being used to capture data provided by the at least one memory device;

performing memory access operations on the at least one memory device, the memory access operations being performed with different time delays for a first edge of the routed control signal so as to vary times for capturing the data provided during the memory access operations, and recording results of the memory access operations;

selecting a time delay from the time delays used with the routed control signal;

utilizing the selected time delay for the routed control signal in performing subsequent memory access operations on the at least one memory device;

determining that a current operating temperature is outside of a predetermined temperature range;

responsive to the determination, repeating performing the memory access operations on the at least one memory device and selecting a new time delay for the routed control signal;

utilizing the selected new time delay for the routed control signal in subsequent memory access operations on the at least one memory device; and following the determining, suspending responding to user input until the new time delay for the routed control signal is selected.

12. A method for tuning control signals associated with at least one memory device, comprising:

generating, by an integrated circuit, a control signal and sending the control signal to the at least one memory device;

routing the control signal to an input of the integrated circuit, the routed control signal being used to capture data provided by the at least one memory device;

performing memory access operations on the at least one memory device, the memory access operations being performed with different time delays for a first edge of the routed control signal so as to vary times for capturing the data provided during the memory access operations, and recording results of the memory access operations;

selecting a time delay from the time delays used with the routed control signal;

utilizing the selected time delay for the routed control signal in performing subsequent memory access operations on the at least one memory device;

determining that a current operating temperature is outside of a predetermined temperature range;

responsive to the determination, repeating performing the memory access operations on the at least one memory device and selecting a new time delay for the routed control signal;

utilizing the selected new time delay for the routed control signal in subsequent memory access operations on the at least one memory device; and following the determining, flushing and disabling a cache of the integrated circuit; and restoring previous contents of and enabling the cache following selection of the new time delay.

13. A system, comprising:

at least one memory device; and an integrated circuit operatively coupled to the at least one memory device, the integrated circuit comprising circuitry for:

performing a number of memory access operations on the at least one memory device, the memory access operation being performed with different time delays for a first edge of a control signal, the control signal used for capturing data provided by the at least one memory device, and recording results of the memory access operations;

selecting a time delay from the time delays used in the memory access operations; and utilizing the selected time delay in performing subsequent memory access operations on the at least one memory device; and circuitry for measuring a current operating temperature;

wherein the integrated circuit performs the memory access operations on the at least one memory device following an indication that the current operating temperature is outside a temperature range, a new temperature range being defined following each indication.

14. The system of claim 13, wherein the control signal is generated by the integrated circuit and is an input to the at least one memory device and the integrated circuit.

15. The system of claim 13, wherein following selecting the time delay for the control signal, the integrated circuit redefines the temperature range based upon the measured current operating temperature.

16. The system of claim 13, wherein the integrated circuit refrains from further operating temperature measurements until after the time delay for the control signal is selected.

17. The system of claim 13, wherein the system suspends responding to user input until the time delay for the control signal is selected.

18. The system of claim 13, wherein the integrated circuit flushes and disables a cache of the integrated circuit prior to performing the memory access operations, and restores previous contents of and enables the cache following selection of the time delay.

19. The method of claim 8, wherein the integrated circuit comprises an integrated circuit chip and the input comprises an input of the integrated circuit chip.

20. A method for tuning control signals associated with at least one memory device, comprising:

performing a number of memory access operations on the at least one memory device, the memory access operation being performed with different time delays for a first edge of a control signal, the control signal used for capturing data provided by the at least one memory device, and recording results of the memory access operations;

selecting a time delay from the time delays used in the memory access operations;

utilizing the selected time delay in performing subsequent memory access operations on the at least one memory device; and prior to performing, suspending responding to user input until the time delay for the control signal is selected.

21. A method for tuning control signals associated with at least one memory device, comprising:

performing a number of memory access operations on the at least one memory device, the memory access operation being performed with different time delays for a first edge of a control signal, the control signal used for capturing data provided by the at least one memory device, and recording results of the memory access operations;

selecting a time delay from the time delays used in the memory access operations;

utilizing the selected time delay in performing subsequent memory access operations on the at least one memory device; and prior to performing, flushing and disabling a cache; and restoring previous contents of and enabling the cache following selection of the time delay.

* * * * *